United States Patent [19]

Nodar

[11] Patent Number: 5,122,759
[45] Date of Patent: Jun. 16, 1992

[54] CLASS-A DIFFERENTIAL AMPLIFIER AND METHOD

[75] Inventor: James Nodar, Dallas, Tex.

[73] Assignee: Texas Instruments Incorporated, Dallas, Tex.

[21] Appl. No.: 603,654

[22] Filed: Oct. 25, 1990

[51] Int. Cl.⁵ .............................................. H03F 3/45
[52] U.S. Cl. ...................................... 330/252; 330/261
[58] Field of Search ............... 330/252, 253, 259, 261, 330/257, 277, 288

[56] References Cited

U.S. PATENT DOCUMENTS 5,006,818  4/1991  Koyama et al. ................... 330/261

OTHER PUBLICATIONS

Schmoock, "An Input Stage Transconductance Reduction Technique for High-Slew Rate Operational Amplifiers", *IEEE Journal of Solid-State Circuits*, Dec. 1975, pp. 407-411.

*Primary Examiner*—Steven Mottola
*Attorney, Agent, or Firm*—B. Peter Barndt; Richard Donaldson; William E. Hiller

[57] ABSTRACT

A circuit for the Class-A differential amplification of two input signals.

A first constant current source 22 is connected between a voltage supply terminal 3 and a node 8. A second constant current source 24 is connected between the supply terminal 3 and a node 9. A first transistor T1, with a control electrode connected to input terminal 1, has a conduction path connected between node 8 and a voltage supply terminal 10. A second transistor T2, with a control electrode connected to input terminal 2, has a conduction path connected between node 9 and terminal 10. A third transistor T3, with a control electrode connected to input terminal 1, has a conduction path connected between node 9 and an output terminal 6. Finally, a fourth transistor T4, with a control electrode connected to input terminal 2, has a conduction path connected between node 8 and an output terminal 7.

31 Claims, 4 Drawing Sheets

CLASS-A DIFFERENTIAL AMPLIFIER AND METHOD

BACKGROUND OF THE INVENTION

1. Field of the Invention

The present invention relates to transistor amplifier circuits and, more particularly, to class-A differential amplifier circuits.

2. Description of the Related Art

Figure 1:
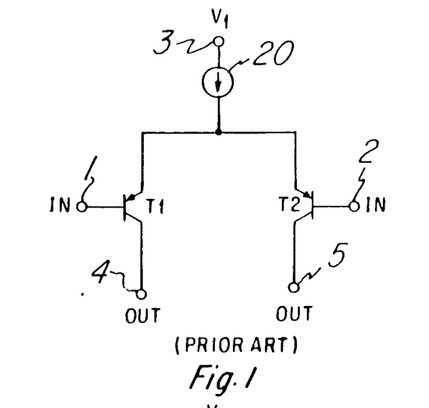
FIG. 1 is a schematic view of a prior art differential amplifier circuit.
Figure 2:
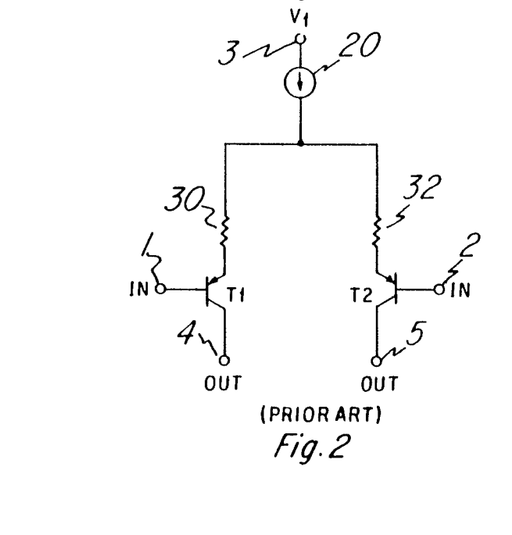
FIG. 2 is a schematic view of a prior art differential amplifier circuit with degeneration resistors.

One of the most common transistor amplifier configurations used in amplifier circuit design is the differential amplifier, an example of which is shown in FIG. 1. Two input signals are applied to terminals 1 and 2, respectively, and are amplified by transistors T1 and T2, respectively. Both transistors are driven by current source 20. The output signal presented across terminals 4 and 5 is an amplification of the differential signal applied across input terminals 1 and 2. In this design, both transconductance ($g_m$) and maximum output current are directly set by the tail current source 20 (maximum output current is defined as the maximum differential current available from the output of a differential amplifer when the inputs are unbalanced enough to cause all of the tail current to flow out of one side of the circuit). In order to achieve flexibility in design (i.e. to obtain independence of these two design parameters), emitter degeneration is commonly used as shown in FIG. 2. Emitter resistors 30 and 32 set an upper bound on transconductance, independent of the emitter current (i.e. the maximum output current).

It should be noted that although all of the figures illustrated herein show amplifiers constructed with bipolar transistors, the concepts can be easily extended to allow the use of any controllable amplification device. For example, the use of JFETs or MOSFETs in the differential amplifier gives performance similar to degenerated bipolar devices due to their inherently lower transconductance.

When an active load is connected to a differential amplifier, the input-referred voltage noise of the active load is defined as the noise current of the load divided by the input stage transconductance. Input-referred voltage noise of low transconductance input stages is usually dominated by the load, since its noise currents increase proportional to the square root of its collector current. Input-referred voltage noise can become quite large when the input stage transconductance is lowered by degeneration, since there is no tracking of this transconductance and the noise current of the load.

Figure 3:
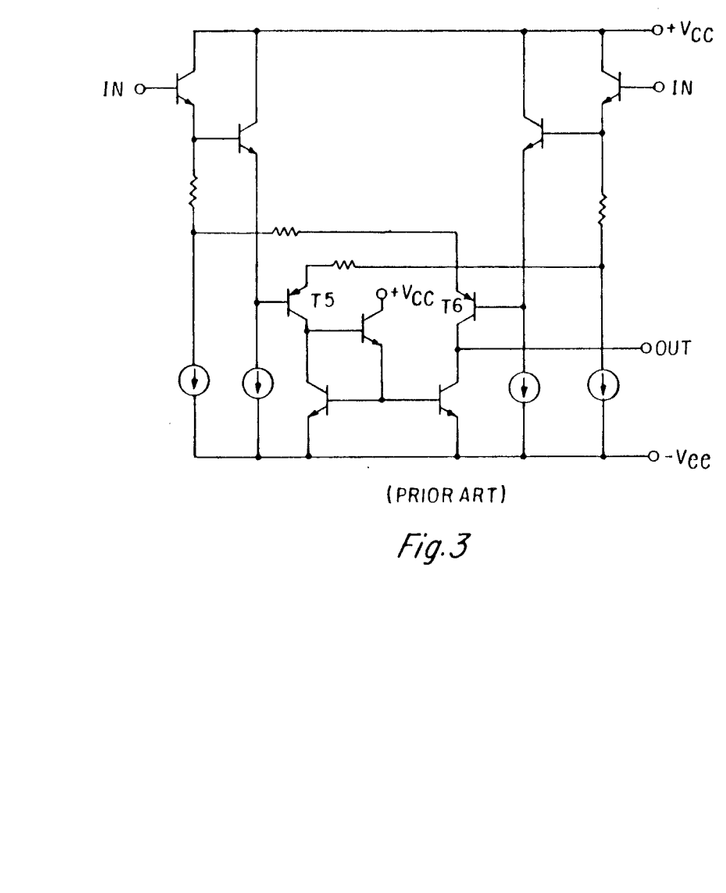
FIG. 3 is a schematic view of a prior art differential amplifier circuit using complementary transistors.

Another prior art topology, shown in FIG. 3, uses complementary transistors and resistors to make the maximum output current limited only by the differential input voltage, allowing some independence of maximum output current and transconductance. Unfortunately, base-emitter characteristics of complementary transistors do not track in practice and therefore T5 and T6 collector currents are unpredictable. Also, it may be undesirable not to set a maximum output current independent of the differential input voltage levels.

Operational Amplifiers (Op Amps), for instance, are designed to be slew rate limited by a capacitance charged by the maximum output current of the input stage differential amplifier, and this limits the maximum rate of change of voltage on each node in the circuit. Since Op Amps are biased by current sources rather than by voltage, the problems of bias circuit recovery, as discussed in U.S. Pat. No. 4,879,524, become prevalent and may even lead to complete shutdown of the bias circuit. The input-referred voltage noise is roughly the same as that in the circuit of FIG. 2.

Figure 4:
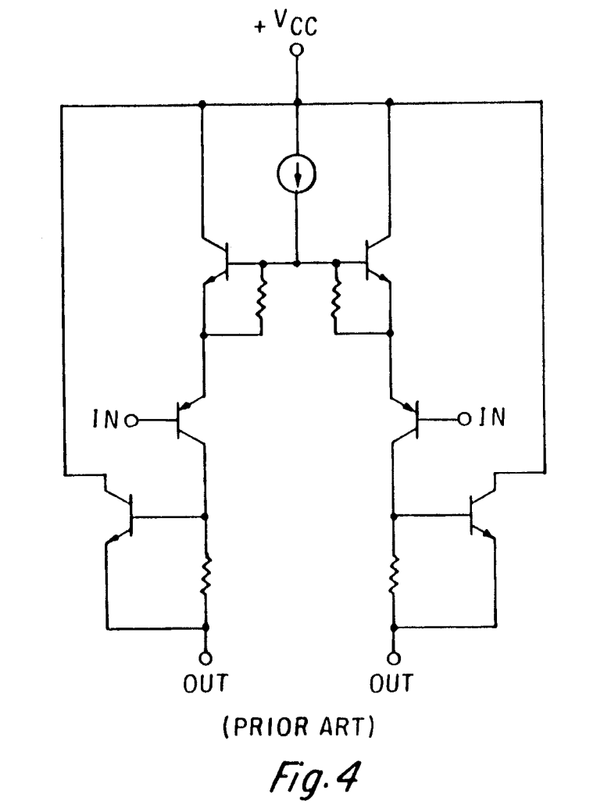
FIGS. 4 and 5 are schematic views of prior art Class-B differential amplifiers.
Figure 5:
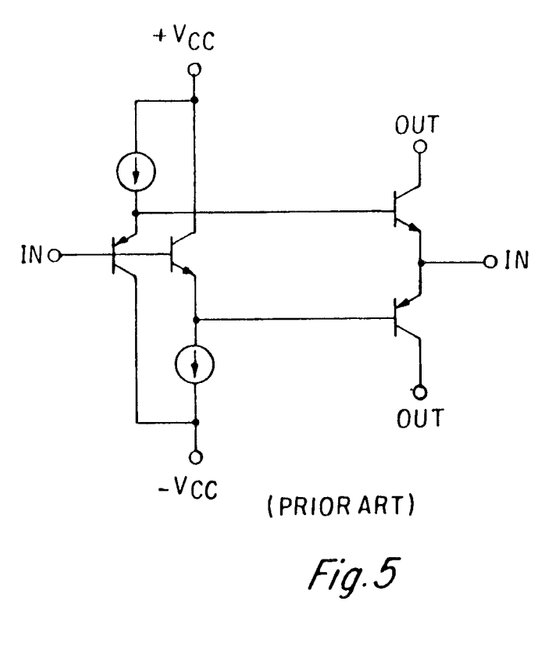

Class-B differential amplifiers, such as those shown in FIGS. 4 and 5, switch a low quiescent current into a large maximum output current. The main advantage of this design is that a higher input stage transconductance can be used to reduce the input-referred voltage noise of the load. There are also, however, several disadvantages such as unpredictable switching thresholds and a maximum output current that is difficult to control. Since the maximum output current can be very large, extra capacitance must be added to limit the maximum rate of change of critical node voltages, as previously discussed with reference to FIG. 3. A particular disadvantage with the circuit of FIG. 5 is that the output is not double-ended, thus restricting general use.

Therefore, it can be seen that the need exists for a differential amplifier design that allows for independent control of input stage transconductance and maximum output current without any of the limitations of the previously discussed prior art circuits.

SUMMARY OF THE INVENTION

In accordance with the present invention, a Class-A differential amplifier is disclosed for high-speed, low-noise applications. The amplifier provides a means for independent control of small signal transconductance and large signal maximum output current.

Figure 6:
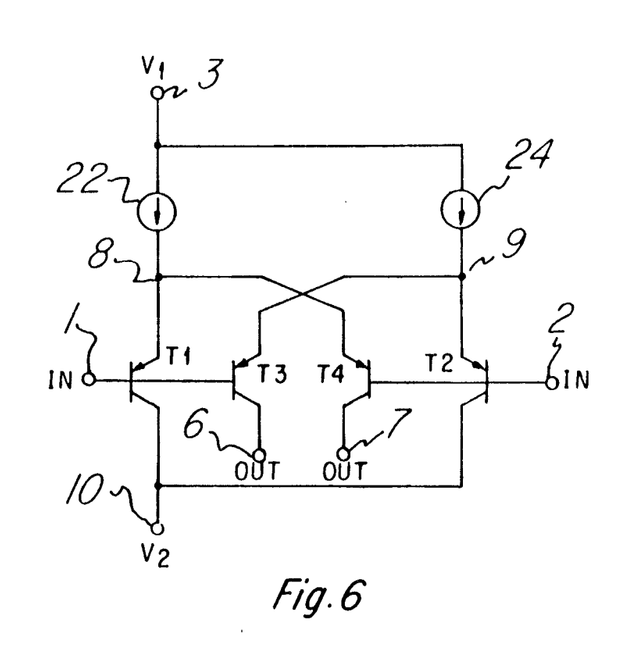
FIG. 6 is a schematic view of a first preferred embodiment of a Class-A differential amplifier.

In a preferred embodiment and with reference to FIG. 6, a first constant current source 22 is connected between a voltage supply terminal 3 and a node 8. A second constant current source 24 is connected between the supply terminal 3 and a node 9. A first transistor T1, with a control electrode connected to input terminal 1, has a conduction path connected between node 8 and a voltage supply terminal 10. A second transistor T2, with a control electrode connected to input terminal 2, has a conduction path connected between node 9 and terminal 10. A third transistor T3, with a control electrode connected to input terminal 1, has a conduction path connected between node 9 and an output terminal 6. Finally, a fourth transistor T4, with a control electrode connected to input terminal 2, has a conduction path connected between node 8 and an output terminal 7.

In another embodiment, the differential amplifier of the invention can be degenerated by the addition of degeneration resistors in series with the conduction path of each transistor. Such an arrangement provides further control over small signal transconductance.

In accordance with a further embodiment, Class-B current boost is added to the differential amplifier of the invention by the addition of a mirror circuit in parallel with each current source, providing increased maximum output current during large signal operation.

DESCRIPTION OF THE PREFERRED EMBODIMENTS

FIG. 6, illustrating a first preferred embodiment of the invention, is an improvement over the prior art differential amplifier circuit of FIG. 1 in which both transconductance and differential output current can be designed independently. The amplifier is comprised of a pair of constant current sources 22 and 24, each having an input coupled to a terminal 3 for receiving supply voltage $V_1$ and an output coupled to a node 8 and a node 9, respectively. The amplifier is further comprised of four transistors T1, T2, T3 and T4. Transistor T1 has an emitter coupled to node 8, a base coupled to terminal 1 for receiving a first input signal, and a collector coupled to a further supply voltage input terminal 10 for receiving a supply voltage $V_2$ which is negative with respect to the supply voltage $V_1$. Transistor T2 has an emitter coupled to node 9, a base coupled to terminal 2 for receiving a second input signal, and a collector coupled to supply terminal 10. Transistor T3 has an emitter coupled to node 9, a base coupled to input terminal 1, and a collector coupled to a first output terminal 6. Lastly, transistor T4 has an emitter coupled to node 8, a base coupled to input terminal 2, and a collector coupled to a second output terminal 7.

In operation, the amplifier of FIG. 6 behaves as a pair of differential amplifiers joined in parallel to form a composite differential amplifier. Each half of the amplifier is composed of ratioed transistors (T1/T4 and T2/T3) which divide the tail current of current sources 22 and 24 into collector currents which are set by the respective emitter-area ratios. The output of the composite amplifier is taken from the collectors of similarly scaled transistors in each individual amplifier pair, i.e. terminals 6 and 7. The ability to select tail current values and emitter scaling ratios independently for each half of the amplifier allows for independent design of amplifier transconductance in small signal operation and maximum output current in large signal operation as are required, for example, in high-speed Op Amp design.

Low input-referred noise voltage of low input stage transconductance circuits with active loads is achieved by reducing the quiescent current noise of the load (which is proportional to the square root of collector current) while simultaneously making input stage transconductance track this load current noise, as is achieved via input stage emitter ratioing. For example, the $g_m$ of the circuit in FIG. 6 is primarily set by the currents that flow through T3 and T4. Since the load also operates at this current, its noise current tracks the differential amplifier $g_m$. While this is also true of the circuit in FIG. 1, the $g_m$ of that circuit can only be lowered by sacrificing maximum output current (i.e. degeneration). By contrast, the circuit of FIG. 6 can be designed for a lower $g_m$ by the use of emitter-area scaling.

The increase of maximum output current and decrease of noise is a figure of merit for which the present invention is capable of a significantly improved "maximum output current/noise" quotient over the simple circuits of FIGS. 1 and 2 when circuits with the same transconductance and maximum output current are compared.

Figure 7:
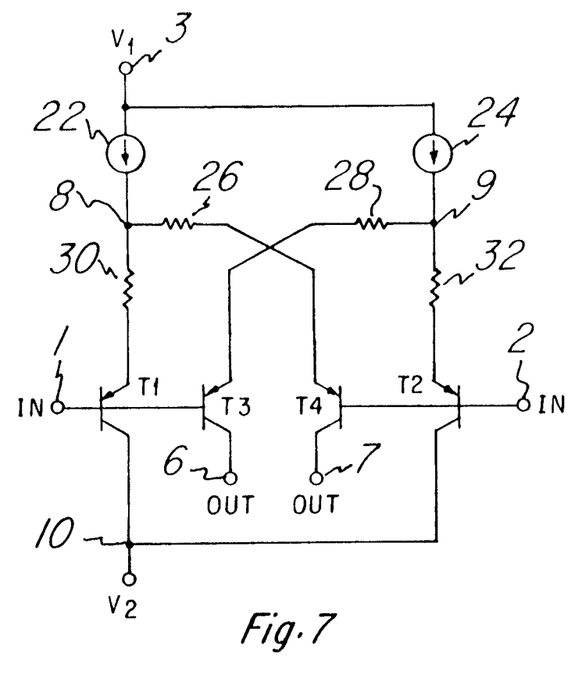
FIG. 7 is a schematic view of a second preferred embodiment of a Class-A differential amplifier.

Further control over the input stage transconductance of the present invention is achieved by the use of degeneration resistors in a second preferred embodiment of the invention as shown in FIG. 7. A resistor 26 is connected between node 8 and the emitter of transistor T4, a resistor 28 is connected between node 9 and the emitter of transistor T3, a resistor 30 is connected between node 8 and the emitter of transistor T1 and a resistor 32 is connected between node 9 and the emitter of transistor T2. This circuit exhibits more insensitivity to inherent component mismatches over the prior art circuits. For any mismatch in the degeneration resistors, there is a smaller voltage drop across the resistors in FIG. 7 because the current has been scaled down. Therefore, the offset voltage (i.e. the imbalance applied to the input terminals necessary to achieve equal currents from each collector output) of the circuit of the present invention is not as high as for prior art differential amplifiers with the same maximum output current and transconductance.

Saturation current ($V_{be}$) mismatch is also reduced with large emitter-area ratios. This is due to the fact that the two transistors connected to each current source can operate at extremely different currents, depending on the emitter-area scaling ratio. Since a change of $V_{be}=18$ mV will double (or halve) the collector current of a device independent of operating current level, a small change in current in the high-current device can give a manifold change in the operating current of the low-current device. Hence, very little offset voltage is needed to correct for $V_{be}$ differences between paired devices. Comparisons using SPICE simulations have shown that the circuit of FIG. 7 has decreased sensitivity to component mismatches by approximately a factor of five over the prior art circuit of FIG. 1 operating at the same transconductance and maximum output current, even through there are many more components in the circuit of the present invention.

The threshold of large signal operation (defined as the input voltage required to deliver maximum output current) for the circuit of FIG. 7 is also lower than for the degenerated simple differential amplifier of FIG. 2 operating at the same transconductance and maximum output current. This is due to the fact that smaller resistor values are necessary to achieve the same transconductance since the emitter-area ratio scales one device to operate at lower currents and therefore have a lower transconductance. In large signal operation, this smaller resistor develops less voltage drop when all of the current in one tail current source flows through it than is the case for the circuit of FIG. 2.

Various modifications to the preferred embodiments may be made while retaining the basic features of the emitter-ratioed differential amplifier.

A first modification may be made by substituting any controllable amplification device for the bipolar transistors shown in FIGS. 6 and 7. For example, JFETs or MOSFETs are easily substituted and allow for a differential amplifier with lower transconductance without the use of degeneration resistors.

Figures 8, 9, 10:
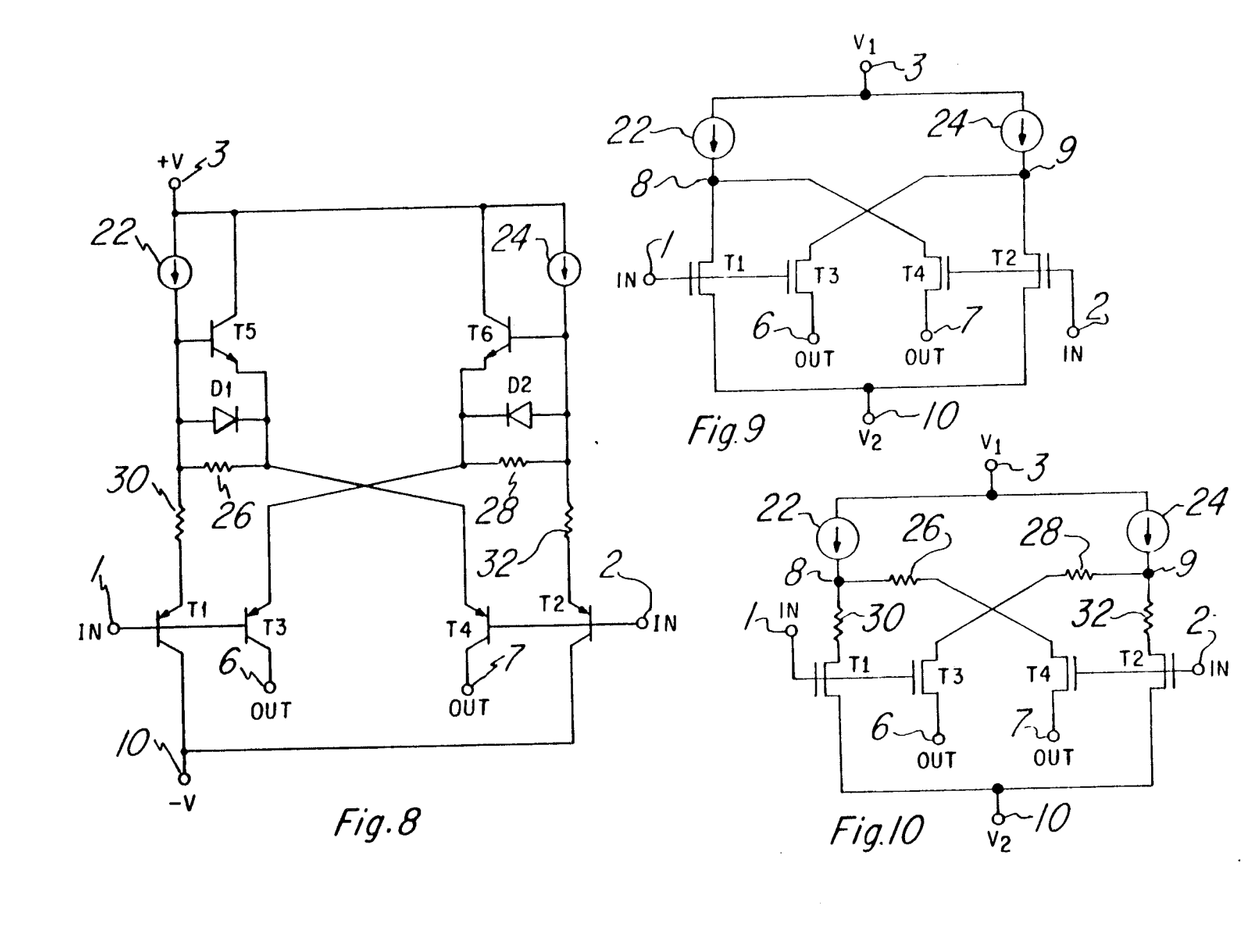
FIG. 8 is a schematic view of a modification to the second preferred embodiment circuit.
FIG. 9 is a schematic view of the first preferred embodiment with FETs substituted for T1-T4.
FIG. 10 is a schematic view of the second preferred embodiment with FETs substituted for T1-T4.

A second modification may be made to add Class-B current boost in large signal operation as shown in FIG. 8. In this circuit, the small signal voltage on resistors 26 and 28 is designed to be less than $V_{be}$ of mirror transistors T5/T6 so that the mirror is effectively off. In large signal operation, the voltage across resistors 26 and 28 would be larger than $V_{be}$ if the mirror were not in the circuit. Since the mirror is in the circuit, however, resistors 26 and 28 are clamped to $V_{be}$ and the extra current goes into the mirror (which can be scale-up or scale-down based on emitter-area ratios), thus providing increased current to output transistors T3 and T4. A further advantage of the $V_{be}$ clamp is that the voltage across resistors 26 and 28 (now limited to $V_{be}$ instead of I*R) allows the inputs at terminals 1 and 2 to go closer to the positive supply (+V) before saturating current sources 22 and 24. The diodes D1 and D2 could be omitted, but this gives uncontrolled maximum output current (as was previously discussed with FIGS. 4 and 5) since what was previously diode current is now base current to transistors T5 and T6.

Additionally, any of the preferred embodiments or modifications thereof may be constructed with transistors of the opposite polarity, with the current sources 22 and 24 tied to supply terminal 10 (−V).

Advantages of the preferred embodiments include their lower input-referred voltage noise, slew rate, offset voltage and large signal threshold compared to prior art circuits, as well as their flexibility in optimizing these parameters. The circuit of the present invention can be substituted in place of any differential amplifier in applications where the comparison of two voltages is required as a double-ended input. Such functional blocks include amplifiers, regulators, references and comparators.

What is claimed is:

1. A differential amplifier circuit adapted to receive a first constant current at a first circuit node and a second constant current at a second circuit node, comprising:
    a first transistor, having a control electrode operatively coupled to a first circuit input terminal and a conduction path with a first end operatively coupled to said first circuit node and a second end operatively coupled to a first circuit voltage supply terminal;
    a second transistor, having a control electrode operatively coupled to a second circuit input terminal and a conduction path with a first end operatively coupled to said second circuit node and a second end operatively coupled to said first voltage supply terminal;
    a third transistor, having a control electrode operatively coupled to said first input terminal and a conduction path with a first end operatively coupled to said second circuit node and a second end operatively coupled to a first circuit output terminal, wherein said second end is not coupled to said first voltage supply terminal;
    a fourth transistor, having a control electrode operatively coupled to said second input terminal and a conduction path with a first end operatively coupled to said first circuit node and a second end operatively coupled to a second circuit output terminal, wherein said second end is not coupled to said first voltage supply terminal.

2. A differential amplifier circuit as recited in claim 1, wherein said transistors are bipolar.

3. A differential amplifier circuit as recited in claim 2, wherein:
    said first transistor and said second transistor are a first pair of ratioed transistors with substantially equal emitter-areas; and
    said third transistor and said fourth transistor are a second pair of ratioed transistors with substantially equal emitter-areas.

4. A differential amplifier circuit as recited in claim 1, wherein said transistors are field effect devices.

5. A differential amplifier circuit as recited in claim 4, wherein:
    said first transistor and said second transistor are a first pair of ratioed transistors with substantially equal channel-areas; and
    said third transistor and said fourth transistor are a second pair of ratioed transistors with substantially equal channel-areas.

6. A differential amplifier circuit as recited in claim 1, further comprising:
    a first transconductance limiting device operatively coupled between said first circuit node and said first end of said first transistor conduction path;
    a second transconductance limiting device operatively coupled between said second circuit node and said first end of said second transistor conduction path;
    a third transconductance limiting device operatively coupled between said first circuit node and said first end of said fourth transistor conduction path; and
    a fourth transconductance limiting device operatively coupled between said second circuit node and said first end of said third transistor conduction path;

7. A differential amplifier circuit as recited in claim 6 wherein:
    said first transconductance limiting device is a first degeneration resistor;
    said second transconductance limiting device is a second degeneration resistor;
    said third transconductance limiting device is a third degeneration resistor; and
    said fourth transconductance limiting device is a fourth degeneration resistor.

8. A differential amplifier circuit as recited in claim 7, wherein:
    said first degeneration resistor and said second degeneration resistor have substantially the same resistance; and
    said third degeneration resistor and said fourth degeneration resistor have substantially the same resistance.

9. A differential amplifier circuit adapted to receive a first constant current at a first circuit node and a second constant current at a second circuit node, comprising:
    a first transistor, having a control electrode operatively coupled to a first circuit input terminal and a conduction path with a first end operatively coupled to said first circuit node and a second end operatively coupled to a first circuit voltage supply terminal;
    a second transistor, having a control electrode operatively coupled to a second circuit input terminal and a conduction path with a first end operatively coupled to said second circuit node and a second end operatively coupled to said first voltage supply terminal;

a third transistor, having a control electrode operatively coupled to said first input terminal and a conduction path with a first end operatively coupled to said second circuit node and a second end operatively coupled to a first circuit output terminal;

a fourth transistor, having a control electrode operatively coupled to said second input terminal and a conduction path with a first end operatively coupled to said first circuit node and a second end operatively coupled to a second circuit output terminal;

a first transconductance limiting device operatively coupled between said first circuit node and said first end of said first transistor conduction path;

a second transconductance limiting device operatively coupled between said second circuit node and said first end of said second transistor conduction path;

a third transconductance limiting device operatively coupled between said first circuit node and said first end of said fourth transistor conduction path;

a fourth transconductance limiting device operatively coupled between said second circuit node and said first end of said third transistor conduction path;

a first current boost circuit operatively coupled between a first voltage supply terminal, said first circuit node, and said fourth transistor conduction path; and a second current boost circuit operatively coupled between said first voltage supply terminal, said second circuit node, and said third transistor conduction path.

10. A differential amplifier circuit as recited in claim 9, wherein:

said first current boost circuit further comprises:
a fifth transistor having a control electrode operatively coupled to said first circuit node and a conduction path operatively coupled between said first voltage supply terminal and said fourth transistor conduction path;
a first diode operatively coupled between said first circuit node and said fourth transistor conduction path; and said second current boost circuit further comprises:
a sixth transistor having a control electrode operatively coupled to said second circuit node and a conduction path operatively coupled between said first voltage supply terminal and said third transistor conduction path;
a first diode operatively coupled between said second circuit node and said third transistor conduction path.

11. A differential amplifier circuit, comprising:
a first source of constant current operatively coupled between a first circuit voltage supply terminal and a first circuit node;
a second source of constant current operatively coupled between said first circuit voltage supply terminal and a second circuit node;
a first transistor, having a control electrode operatively coupled to a first circuit input terminal and a conduction path with a first end operatively coupled to said first circuit node and a second end operatively coupled to a second circuit voltage supply terminal;

a second transistor, having a control electrode operatively coupled to a second circuit input terminal and a conduction path with a first end operatively coupled to said second circuit node and a second end operatively coupled to said second voltage supply terminal;

a third transistor, having a control electrode operatively coupled to said first input terminal and a conduction path with a first end operatively coupled to said second circuit node and a second end operatively coupled to a first circuit output terminal, wherein said second end is not coupled to said second voltage supply terminal;

a fourth transistor, having a control electrode operatively coupled to said second input terminal and a conduction path with a first end operatively coupled to said first circuit node and a second end operatively coupled to a second circuit output terminal, wherein said second end is not coupled to said second voltage supply terminal.

12. A differential amplifier circuit as recited in claim 11, wherein said transistors are bipolar.

13. A differential amplifier circuit as recited in claim 12, wherein:
said first transistor and said second transistor are a first pair of ratioed transistors with substantially equal emitter-areas; and
said third transistor and said fourth transistor are a second pair of ratioed transistors with substantially equal emitter-areas.

14. A differential amplifier circuit as recited in claim 11, wherein said transistors are field effect devices.

15. A differential amplifier circuit as recited in claim 14, wherein:
said first transistor and said second transistor are a first pair of ratioed transistors with substantially equal channel-areas; and
said third transistor and said fourth transistor are a second pair of ratioed transistors with substantially equal channel-areas.

16. A differential amplifier circuit as recited in claim 11, further comprising:
a first transconductance limiting device operatively coupled between said first circuit node and said first end of said first transistor conduction path;
a second transconductance limiting device operatively coupled between said second circuit node and said first end of said second transistor conduction path;
a third transconductance limiting device operatively coupled between said first circuit node and said first end of said fourth transistor conduction path; and
a fourth transconductance limiting device operatively coupled between said second circuit node and said first end of said third transistor conduction path;

17. A differential amplifier circuit as recited in claim 16, wherein:
said first transconductance limiting device is a first degeneration resistor;
said second transconductance limiting device is a second degeneration resistor;
said third transconductance limiting device is a third degeneration resistor; and
said fourth transconductance limiting device is a fourth degeneration resistor.

18. A differential amplifier circuit as recited in claim 17, wherein:
   said first degeneration resistor and said second degeneration resistor have substantially the same resistance; and
   said third degeneration resistor and said fourth degeneration resistor have substantially the same resistance.

19. A differential amplifier circuit comprising:
   a first source of constant current operatively coupled between a first circuit voltage supply terminal and a first circuit node;
   a second source of constant current operatively coupled between said first circuit voltage supply terminal and a second circuit node;
   a first transistor, having a control electrode operatively coupled to a first circuit input terminal and a conduction path with a first end operatively coupled to said first circuit node and a second end operatively coupled to a second circuit voltage supply terminal;
   a second transistor, having a control electrode operatively coupled to a second circuit input terminal and a conduction path with a first end operatively coupled to said second circuit node and a second end operatively coupled to said second voltage supply terminal;
   a third transistor, having a control electrode operatively coupled to said first input terminal and a conduction path with a first end operatively coupled to said second circuit node and a second end operatively coupled to a first circuit output terminal;
   a fourth transistor, having a control electrode operatively coupled to said second input terminal and a conduction path with a first end operatively coupled to said first circuit node and a second end operatively coupled to a second circuit output terminal;
   a first transconductance limiting device operatively coupled between said first circuit node and said first end of said first transistor conduction path;
   a second transconductance limiting device operatively coupled between said second circuit node and said first end of said second transistor conduction path;
   a third transconductance limiting device operatively coupled between said first circuit node and said first end of said fourth transistor conduction path;
   a fourth transconductance limiting device operatively coupled between said second circuit node and said first end of said third transistor conduction path;
   a first current boost circuit operatively coupled between said first voltage supply terminal, said first circuit node, and said fourth transistor conduction path; and
   a second current boost circuit operatively coupled between said first voltage supply terminal, said second circuit node, and said third transistor conduction path.

20. A differential amplifier circuit as recited in claim 19, wherein:
   said first current boost circuit further comprises:
      a fifth transistor having a control electrode operatively coupled to said first circuit node and a conduction path operatively coupled between said first voltage supply terminal and said fourth transistor conduction path;
      a first diode operatively coupled between said first circuit node and said fourth transistor conduction path; and
   said second current boost circuit further comprises:
      a sixth transistor having a control electrode operatively coupled to said second circuit node and a conduction path operatively coupled between said first voltage supply terminal and said third transistor conduction path;
      a first diode operatively coupled between said second circuit node and said third transistor conduction path.

21. A method for differentially amplifying a first and a second input voltage comprising the steps of:
   dividing a first constant current and causing a first portion to flow to a voltage supply terminal and a second portion to flow to a first output terminal wherein the magnitudes of said first and said second portions are proportional to the magnitudes of said first and said second input voltages, respectively and wherein said first output terminal is not coupled to said voltage supply terminal; and
   dividing a second constant current and causing a third portion to flow to said voltage supply terminal and a fourth portion to flow to a second output terminal wherein the magnitudes of said third and said fourth portions are proportional to the magnitudes of said second and said first input voltages, respectively and wherein said second output terminal is not coupled to said voltage supply terminal.

22. The method of claim 21, including the further steps of:
   applying a first one of said input voltages to a control electrode of a first and a third transistor;
   applying a second one of said input voltages to a control electrode of a second and a fourth transistor;
   causing said first current portion to flow through said first transistor conduction path to said voltage supply terminal;
   causing said second current portion to flow through said fourth transistor conduction path to said first output terminal;
   causing said third current portion to flow through said third transistor conduction path to said voltage supply terminal;
   causing said fourth current portion to flow through said second transistor conduction path to said second output terminal.

23. The method of claim 22, including the further steps of:
   causing said magnitudes of said first and said second portions to be additionally proportional to a first conduction-path-area ratio of said first and said second transistors; and
   causing said magnitudes of said third and said fourth portions to be additionally proportional to a second conduction-path-area ratio of said third and said fourth transistors.

24. The method of claim 23, including the further step of constructing said transistors as bipolar devices wherein said first and said second conduction-path-area ratios are emitter-area ratios.

25. The method of claim 24, including the further steps of:

constructing said first transistor and said third transistor as a ratioed pair having substantially equal emitter-areas; and constructing said second transistor and said fourth transistor as a ratioed pair having substantially equal emitter-areas.

26. The method of claim 23, including the further step of constructing said transistors as field effect devices wherein said first and said second conduction-path-area ratios are channel-area ratios.

27. The method of claim 26, including the further steps of:

constructing said first transistor and said third transistor as a ratioed pair having substantially equal channel-areas; and constructing said second transistor and said fourth transistor as a ratioed pair having substantially equal channel-areas.

28. The method of claim 23, including the further steps of:

causing said first current portion to flow through a first transconductance limiting device prior to flowing through said first transistor conduction path;

causing said second current portion to flow through a second transconductance limiting device prior to flowing through said second transistor conduction path;

causing said third current portion to flow through a third transconductance limiting device prior to flowing through said third transistor conduction path;

causing said fourth current portion to flow through a fourth transconductance limiting device prior to flowing through said fourth transistor conduction path.

29. The method of claim 28, including the further steps of:

constructing said first transconductance limiting device as a first degeneration resistor;

constructing said second transconductance limiting device as a second degeneration resistor;

constructing said third transconductance limiting device as a third degeneration resistor;

constructing and said fourth transconductance limiting device as a fourth degeneration resistor.

30. The method of claim 29, including the further steps of:

selecting said first and said third degeneration resistors to have substantially equal resistance; and selecting said second and said fourth degeneration resistors to have substantially equal resistance.

31. A method for differentially amplifying a first and a second input voltage, comprising the steps of:

dividing a first constant current and causing a first portion to flow to a voltage supply terminal and a second portion to flow to a first output terminal wherein the magnitudes of said first and said second portions are proportional to the magnitudes of said first and said second input voltages, respectively;

dividing a second constant current and causing a third portion to flow to said voltage supply terminal and a fourth portion to flow to a second output terminal wherein the magnitudes of said third and said fourth portions are proportional to the magnitudes of said second and said first input voltages, respectively;

applying a first one of said input voltages to a control electrode of a first and a third transistor;

applying a second one of said input voltages to a control electrode of a second and a fourth transistor;

causing said first current portion to flow through said first transistor conduction path to said voltage supply terminal;

causing said second current portion to flow through said fourth transistor conduction path to said first output terminal;

causing said third current portion to flow through said third transistor conduction path to said voltage supply terminal;

causing said fourth current portion to flow through said second transistor conduction path to said second output terminal;

causing said magnitudes of said first and said second portions to be additionally proportional to a first conduction-path-area ratio of said first and said second transistors; and causing said magnitudes of said third and said fourth portions to be additionally proportional to a second conduction-path-area ratio of said third and said fourth transistors;

supplying an additional quantity of current into said second transistor conduction path when said second current portion exceeds a first predetermined threshold; and supplying an additional quantity of current into said fourth transistor conduction path when said fourth current portion exceeds a second predetermined threshold.

* * * * *